United States Patent [19]

Kochi

[11] 4,218,282
[45] Aug. 19, 1980

[54] METHOD OF PREPARATION OF CHRYSOBERYL AND BERYL SINGLE CRYSTALS

[75] Inventor: Akihiko Kochi, Suwa, Japan

[73] Assignee: Kabushiki Kaisha Suwa Seikosha, Tokyo, Japan

[21] Appl. No.: 915,847

[22] Filed: Jun. 15, 1978

[30] Foreign Application Priority Data

Jun. 17, 1977 [JP] Japan ................................ 52-72485
Jul. 4, 1977 [JP] Japan ................................ 52-80240

[51] Int. Cl.$^2$ .......................... B01J 17/10; B01J 17/16
[52] U.S. Cl. ........................... 156/620; 156/DIG. 61; 156/DIG. 64; 156/DIG. 78; 156/DIG. 96; 422/250
[58] Field of Search ................... 156/604, 605, 617 R, 156/620, 621, 622, 624, DIG. 61, DIG. 64, DIG. 78, DIG. 96; 23/295 R, 301, 305 A; 422/250

[56] References Cited

U.S. PATENT DOCUMENTS

| | | | |
|---|---|---|---|
| 3,086,856 | 4/1963 | Siebertz | 23/295 X |
| 3,234,135 | 2/1966 | Ballman et al. | 156/624 X |
| 3,341,302 | 9/1967 | Flanigen et al. | 156/624 |
| 3,817,710 | 6/1974 | Mizutani et al. | 156/620 X |
| 3,912,521 | 10/1975 | Cline et al. | 156/604 X |
| 3,943,324 | 3/1976 | Haggerty | 156/620 X |
| 4,046,617 | 9/1977 | Fletcher | 156/620 X |
| 4,058,699 | 11/1977 | van Vloten | 156/620 X |
| 4,093,502 | 6/1978 | Hirabayashi et al. | 156/624 |

Primary Examiner—Joseph Scovronek
Attorney, Agent, or Firm—Blum, Kaplan, Friedman, Silberman & Beran

[57] ABSTRACT

Single crystals of chrysoberyl and beryl are prepared in a process in which the rods are formed of the desired composition and the rods are heated in a controlled atmosphere using infra-red rays. The infra-red rays are focussed upon a restricted portion of a rod to form a melt zone which is moved along the rod. A seed crystal of the desired type is preferably used. Fluxes are unnecessary and twinning is avoided.

23 Claims, 3 Drawing Figures

METHOD OF PREPARATION OF CHRYSOBERYL AND BERYL SINGLE CRYSTALS

BACKGROUND OF THE INVENTION

The present interest in beryl and chrysoberyl single crystals stems largely from the utility of these crystals as laser host materials. However, the study of methods of making such crystals synthetically dates back to the 19th century, the interest at that time being in making available gemstones at a lower price.

It appeared that two different processes might be employed for the manufacture of such crystals, one being the so-called hydrothermal process and the other being the flux process. Although it has been claimed that Nacken used the hydrothermal process successfully, there is considerable confusion about his work, and recent studies lead to the conclusion that the hydrothermal process was never used successfully.

Emeralds of high quality are now being manufactured by the flux process, but the process is relatively slow, due to the fact that the speed of crystallization is low. In general, the maximum achievable rate using the flux process is about 0.1 mm per day.

A wide variety of fluxes have been used in the attempt to increase the rate of crystallization, examples of such fluxes being $Li_2Mo_2O_7$, $Li_2W_2O_7$, $PbMoO_4$, $V_2O_5$, $MoO_3$ and $B_2O_3$. Where these materials have been used as fluxes, the furnace has generally been heated to about 1000° C. and then cooled gradually. Alternatively, the furnace has been constructed so that a gradient is established. Where attempts have been made to increase the rate of crystallization above that noted above, crystallites are formed.

Using the hydrothermal process, the rate of growth is even lower. Also, the efficiency of production of crystals is low. Nevertheless, since beryl single crystal is an incongruent melting material, high efficiency methods of growing crystals, such as the Czochralski method, have not been utilized.

Chrysoberyl is a beryllium aluminate and is famous as a naturally-occurring jewel stone in the form of cat's-eye, alexandrite, etc. In the attempt to make this stone synthetically, fluxes such as $PbO$, $PbO-PbF_2$, $PbO-PbF_2-B_2O_3$ and $Li_2MoO_4-MoO_3$ as well as similar materials have been used as fluxes. However, it has been difficult to obtain large crystals by the use of such flux systems. Moreover, twinning frequently occurs so that it is difficult to obtain single crystals.

In view of the potential utility of chrysoberyl and beryl as laser host materials, it would be eminently desirable that an improved method of producing these materials synthetically in the form of single crystals ranging up to large sizes be available.

SUMMARY OF THE INVENTION

In accordance with the present invention, an appropriate composition is formed into a rod which is supported in upper and lower chucks or axes. The chucks are mounted for rotation in opposite directions, and may also be movable vertically. A melt zone is formed in the rod by means of the combination of a suitable source of infra-red rays and an ellipsoidal reflector; the reflector, termed a "total" ellipsoidal reflector, is actually the surface formed by rotating an ellipse around the major axis. The source of infra-red light is positioned at one focus of the ellipse and the melt zone is positioned at the other focus. A suitable source of infra-red light is a halogen lamp or a xenon lamp. The feed rod and the chucks which support same are preferably sealed into a transparent quartz tube so that the atmosphere around the rod may be controlled.

For the manufacture of chrysoberyl single crystals, the feed rod is molded of a composition of beryllium oxide and $\gamma$-alumina powder. Chromium oxide or chromium oxide and titanium oxide may also be added to the composition. The preferred composition range is 75 to 85 weight % of aluminum oxide with 25 to 15 weight % of beryllium oxide. Also, preferably, the feed rod is melted in an atmosphere of oxygen.

For the manufacture of beryl single crystals which has the composition $3BeO.Al_2O_3.6SiO_2$, the chief constituents in the composition to be melted are $BeO$, $Al_2O_3$ and $SiO_2$. Generally, either the beryllium oxide content or the silicon dioxide content is approximately twice that of the stoichiometry indicated by the above triple oxide formula. Chromium oxide may be added for the production of gems of specifically desired compositions. Thus, the addition of chromium oxide results in a green emerald. It is desirable to use a natural single crystal of beryl as a seed crystal. Preferably, the cut angle with respect to the c-axis should be 60°.

During the melting and crystallization steps, the melt zone is moved upwardly by moving the feed rod downwards, while rotating the upper and lower axes in opposite directions.

Accordingly, an object of the present invention is a method of manufacturing chrysoberyl and beryl single crystals at high rate and in high purity.

Another object of the present invention is a method of manufacturing chrysoberyl and beryl crystals having specific colors, said manufacture being carried out at high rate.

A further object of the present invention is a method of manufacturing chrysoberyl and beryl single crystals of sizes ranging up to large.

An important object of the present invention is a method of manufacturing chrysoberyl and beryl crystals where the method is efficient with respect to the quantity of material used.

A significant object of the present invention is a method of manufacturing chrysoberyl and beryl single crystals in a controlled atmosphere using infra-red light as the heat source.

Still other objects and advantages of the invention will in part be obvious and will in part be apparent from the specification.

The invention accordingly comprises the several steps and the relation of one or more of such steps with respect to each of the others thereof, which will be exemplified in the method hereinafter disclosed, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
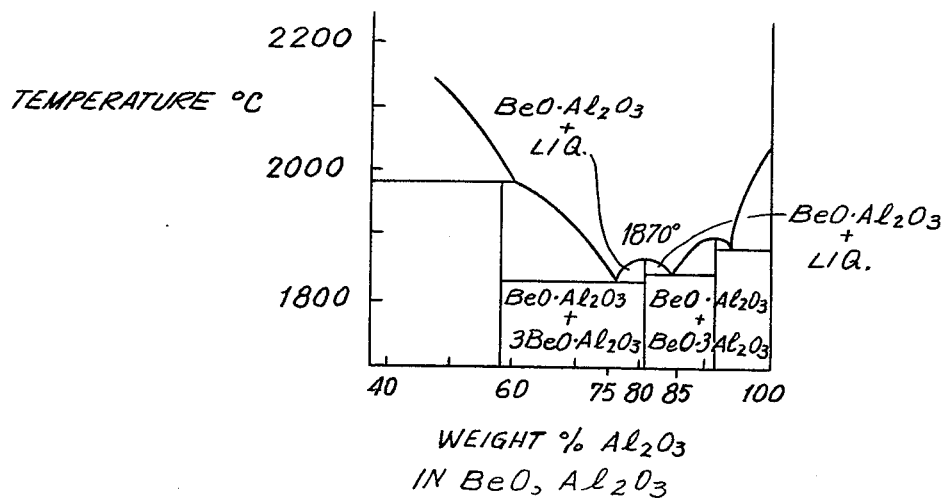
FIG. 1 is a phase diagram for the beryllium oxide-aluminum oxide system illustrating the basis for the present invention.

Generally speaking, the method disclosed herein is suitable for the production of single crystals of chrysoberyl and of beryl, depending upon the nature of the composition processed. Chrysoberyl single crystals are prepared from a composition consisting essentially of beryllium oxide and aluminum oxide. As can be seen from FIG. 1, where the weight percentage of alumina in a composition containing beryllium oxide is from 75 to 85 weight %, then there is a temperature-composition range in which $BeO.Al_2O_3$ and the liquid coexist. If the composition is cooled from about 1870° C. in a crucible, for instance, then only mixed crystals of $3BeO.Al_2O_3$ and $BeO.Al_2O_3$ or $BeO.3Al_2O_3$ and $BeO.Al_2O_3$ are produced; single crystals of $BeO.Al_2O_3$ cannot be obtained in this way.

Figure 2:
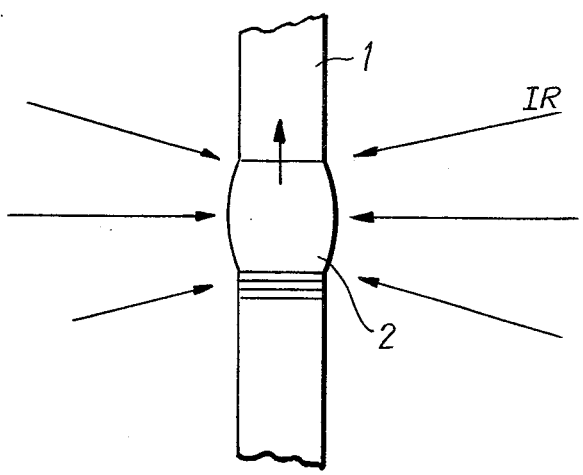
FIG. 2 shows schematically the formation of a melt zone.

The method of the present invention by which such single crystals are obtained is illustrated in FIG. 2 which shows a melt zone 2 formed in part of a feed rod 1 by means of focussed infra-red rays indicated by the characters IR. The content of $Al_2O_3$ in the melt zone 2 is from 75 to 85 weight %. The temperature of the melt zone is raised above 1870° C. and the melt zone is moved upwardly in the feed rod 1 by a technique to be presented below. As the melt zone is moved upwardly, the temperature of the feed rod below the melt zone drops below 1870° C. into the area of the phase diagram in which $BeO.Al_2O_3$ and the liquid coexist. The solid $BeO.Al_2O_3$ remains in the lower portion of the feed rod while the liquid moves upwardly together with the melt zone, producing a single crystal of $BeO.Al_2O_3$ in the lower feed rod. The formation of such a crystal is facilitated if a seed crystal of this material is present in the lower feed rod. Single crystals of beryl, $3BeO.Al_2O_3.6SiO_2$ may be obtained in essentially the same way.

Figure 3:
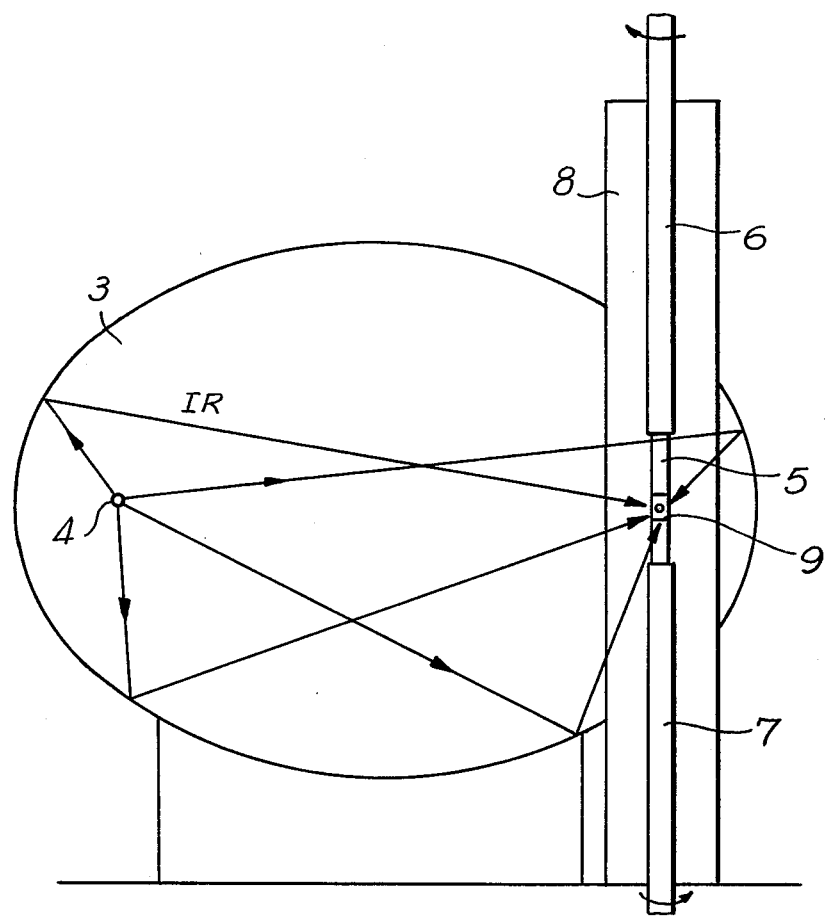
FIG. 3 shows diagrammatically the apparatus used in the process of the present invention.

Apparatus for carrying out the process of the present invention is shown in more detail in FIG. 3. As can be seen from FIG. 3, a halogen lamp or xenon lamp 4 is positioned at one focus of a total ellipsoidal mirror 3, and feed rod 5 passes through the other focus. Feed rod 5 is held from above and below by upper rotation axis 6 and lower rotation axis 7 respectively. These axes are, in effect, chucks. Feed rod 5 and rotation axes 6 and 7 are supported in sealed, transparent quartz tube 8 so that the atmosphere surrounding feed rod 5 can be controlled. Thus, the process can be carried out in vacuo or in the presence of oxygen.

As is well known, an ellipsoidal mirror possesses the property of reflecting light originating at one focus to the other focus. Accordingly, only that portion of feed rod 5 which is actually at the focal point is heated. This portion of the rod is then the melt zone 9. The melt zone 9 can be moved in the feed rod by moving rotation axes 6 and 7 vertically. Moreover, it is generally preferable to rotate axes 6 and 7 in opposite directions during the melting and crystallization process.

The following examples illustrate the production of chrysoberyl and of beryl single crystals of various types by the method of the present invention.

EXAMPLE 1

A mix of 25 g of beryllium oxide powder, 75 g of γ-alumina powder and 3 g of chromium oxide powder is prepared in a pot mill. The mix is compression-molded into a rod and calcined at 1200° C. The feed rod is positioned in a total ellipsoidal mirror and moved at a rate of 5 mm/hour. Perfect crystals of dark green alexandrite are obtained.

EXAMPLE 2

A feed rod of a composition consisting of 80 weight % of aluminum oxide and 20 weight % of beryllium oxide is prepared as above and positioned in a total ellipsoidal mirror. The rod is heated until a melt zone appears and the rod is moved as aforenoted. Perfect single crystals of chrysoberyl are obtained.

EXAMPLE 3

A feed rod is prepared of two different mixes, the composition at one end of the feed rod being 80 weight % of aluminum oxide and 20 weight % beryllium oxide. The remainder of the feed rod consists of beryllium oxide, aluminum oxide and chromium oxide in a composition which may approximate that of Example 1. The feed rod is positioned in the upper chuck with the aforenoted end positioned at the focus so that the aforenoted end is to become the melt zone. A chrysoberyl seed single crystal is mounted in the lower chuck. The upper and lower chucks are rotated in opposite directions. The transfer of energy from the lamp to the melt zone is initiated, and after formation of the melt zone, the seed crystal is brought into contact with same. The process is then carried out as before with the melt zone being moved upwardly. Crystals of alexandrite which are 10 mm in diameter and 8 cm in length are obtained in this way.

EXAMPLE 4

A mixture of 60 g of aluminum oxide, 5 g of beryllium oxide, 1 g of chromium oxide and 0.5 g of titanium oxide is prepared in a pot mill; the mixture is formed into a rod by hot pressing at 800° C. at a pressure of 30 kg/cm². The feed rod is then set in the total ellipsoidal mirror so that it traverses a focus and crystal growth is performed with the rod enveloped in oxygen at a pressure of 4 kg/cm². Chrysoberyl striated so that it resembles cat's-eye is obtained.

The formation of single crystals of beryl is effected in completely similar manner except for the composition of the mix. The process as used for the preparation of beryl is exemplified as follows:

EXAMPLE 5

A mix of 75 g of beryllium oxide, 51 g of aluminum oxide and 134 g of silicon dioxide is prepared by mixing in a pot mill for 24 hours. It will be noted that the content of beryllium oxide relative to the alumina is twice that called for by the stoichiometry, the stoichiometric amounts being 37.5 g BeO, 51 g $Al_2O_3$ and 360 g $SiO_2$. The mix is formed into a rod about 10 mm in diameter and 10 cm in length through the use of an appropriate press such as the Rubber Press, and then calcined at 1150° C. Light from the lamp is focussed onto the feed rod, positioned within the ellipsoidal mirror, the melt zone is moved upwardly, and beryl single crystals are obtained.

EXAMPLE 6

A rod is prepared from a mix consisting of 37.5 g of beryllium oxide, 51 g of aluminum oxide, 264 g of silicon dioxide and 13 g of chromium oxide by hot pressing at 800° C. at a pressure of 30 kg/cm². Infra-red rays are focussed onto the feed rod and the melt zone is moved as described above. Green emerald single crystals of high quality are obtained, the chromium oxide providing the color for the beryl crystal.

EXAMPLE 7

A feed rod is prepared from a mix consisting of 37.5 g of beryllium oxide, 51 g of aluminum oxide, 134 g of silicon dioxide and 13 g of chromium oxide by hot-pressing at 900° C. at a pressure of 25 kg/cm². The feed rod is fixed to the upper chuck within a total ellipsoidal mirror and a natural beryl single crystal is fixed to the lower chuck as a seed crystal. The cut angle of the seed crystal with respect to the c-axis is 60°. After melting the lower portion of the feed rod, the seed crystal is soaked in the melt zone by moving the lower chuck upwardly. The feed rod is then moved downwardly, rotating the upper and lower chucks in opposite directions. Large emerald single crystals are obtained in this way.

EXAMPLE 8

A composition consisting of 37.5 g of beryllium oxide, 51 g of γ-alumina and 134 g of silicon dioxide is mixed in a pot mill for 48 hours and then formed into a rod using a Rubber Press and calcined at 1100° C. The feed rod is positioned in the total ellipsoidal mirror and oxygen is introduced around the rod to a pressure of 5 atmospheres. Infra-red rays are focussed onto the feed rod to produce a melt zone and the melt zone is moved upwardly along the rod producing beryl crystals of high quality.

As indicated in the above examples, the method disclosed herein makes it possible to obtain large, perfect single crystals of chrysoberyl and beryl with great ease. Moreover, those factors in the conventional processes which resulted in the production of crystallites or single crystals with defects are overcome in the present process. Accordingly, single crystals of chrysoberyl and beryl thus become readily available for various types of industrial applications such as in the laser.

It will thus be seen that the objects set forth above, among those made apparent from the preceding description, are efficiently attained and, since certain changes may be made in carrying out the above method without departing from the spirit and scope of the invention, it is intended that all matter contained in the above description shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method of manufacturing chrysoberyl and beryl single crystal, comprising the steps of shaping a mix into a rod, forming a melt zone in said rod by use of infra-red rays generated by one of a halogen lamp and a xenon lamp, said lamp and said melt zone being positioned respectively at the first and second foci of an internally reflecting ellipsoid, and moving said rod through said second focus, thereby moving said melt zone along said rod, said mix in the portion of the rod to be converted into said single crystal consisting essentially of alumina and beryllium oxide for manufacture of chrysoberyl, and of alumina, beryllium oxide and silica for manufacture of beryl.

2. The method as defined in claim 1, wherein said single crystal is of chrysoberyl and said rod in said melt zone consists essentially of 15 to 25 weight % of beryllium oxide and 85 to 75 weight % of aluminum oxide.

3. The method of claim 1, wherein said feed rod is rotated during the step of moving said melt zone along said rod.

4. The method as defined in claim 1, wherein said single crystal is of chrysoberyl and further comprising the step of introducing a chrysoberyl seed single crystal into said melt zone.

5. The method as defined in claim 2, wherein said aluminum oxide is γ-alumina.

6. The method as defined in claim 1, wherein said mix contains chromium oxide in minor amount for coloring same.

7. The method as defined in claim 1, wherein said feed rod is enveloped in an atmosphere of oxygen during said steps of forming a melt zone and moving said melt zone along said rod.

8. The method as defined in claim 1, wherein said single crystal is of beryl and said melt zone of said feed rod consists essentially of beryllium oxide, aluminum oxide and silicon oxide.

9. The method as defined in claim 8, further comprising the step of introducing a beryl seed single crystal into said melt zone.

10. The method as defined in claim 8, wherein said aluminum oxide is in the form of γ-alumina.

11. The method as defined in claim 9, wherein said beryl feed single crystal is cut at an angle of 60° with respect to the c-axis thereof.

12. The method as defined in claim 1, wherein said feed rod has two ends, each of said ends is mounted in a chuck and said chucks are rotated during movement of said feed rod through said second focus.

13. The method as defined in claim 12, wherein said chucks are rotated in opposite directions.

14. The method as defined in claim 12, wherein said rod is mounted vertically and said chucks are moved in a downward direction, thereby moving said melt zone upwardly with respect to said feed rod.

15. The method as defined in claim 2, wherein said rod, except for one end thereof, consists of beryllium oxide, aluminum oxide and chromium oxide, said one end consisting essentially of 80 weight % of aluminum oxide and 20 weight % of beryllium oxide, said melt zone is first formed in said one end, and a chrysoberyl feed single crystal is then brought into contact with said melt zone.

16. The method as defined in claim 1, wherein said rod consists of beryllium oxide, alumina and chromium oxide in a weight ratio of 25:75:3.

17. The method as defined in claim 1, wherein said melt zone is moved along said rod at a rate of about 5 mm/hr.

18. The method as defined in claim 1, wherein said single crystal is of chrysoberyl and said mix consists essentially, of aluminum oxide, beryllium oxide, chromium oxide and titanium oxide in a ratio of approximately 60:5:1:0.5, said steps of forming a melt zone in said rod and moving said melt zone along said rod being carried out in an atmosphere of oxygen.

19. The method as defined in claim 1, wherein said mix consists essentially of beryllium oxide, aluminum oxide, silicon dioxide and chromium oxide in a ratio of approximately 37.5:51:264:13.

20. The method as defined in claim 1, wherein said mix consists essentially of beryllium oxide, aluminum oxide and silicon dioxide in a ratio of approximately 75:51:134.

21. The method as defined in claim 8, wherein said mix consists essentially of beryllium oxide, aluminum oxide, silicon dioxide and chromium dioxide in a ratio of approximately 37.5:51:134:13.

22. The method as defined in claim 1, wherein said mix consists essentially of beryllium oxide, γ-alumina and silicon dioxide in a ratio of approximately 37.5:51:134.

23. The method as defined in claim 1, wherein said single crystal is of beryl and said rod in said melt zone consists essentially of 37.5 to 75 g of beryllium oxide and 134 to 264 g of silica for each 51 g of alumina.

* * * * *